(12) United States Patent
Takei

(10) Patent No.: US 9,716,159 B1
(45) Date of Patent: Jul. 25, 2017

(54) METHOD OF MANUFACTURING SILICON CARBIDE SEMICONDUCTOR DEVICE

(71) Applicant: Fuji Electric Co., Ltd., Kanagawa (JP)

(72) Inventor: Manabu Takei, Ibaraki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/375,045

(22) Filed: Dec. 9, 2016

(30) Foreign Application Priority Data

Jan. 13, 2016 (JP) .................................. 2016-004222

(51) Int. Cl.
| | | |
|---|---|---|
| H01L 29/66 | (2006.01) | |
| H01L 29/78 | (2006.01) | |
| H01L 21/04 | (2006.01) | |
| H01L 21/02 | (2006.01) | |
| H01L 21/311 | (2006.01) | |
| H01L 29/423 | (2006.01) | |

(52) U.S. Cl.
CPC .... *H01L 29/66068* (2013.01); *H01L 21/0217* (2013.01); *H01L 21/02123* (2013.01); *H01L 21/02126* (2013.01); *H01L 21/02164* (2013.01); *H01L 21/02236* (2013.01); *H01L 21/0475* (2013.01); *H01L 21/31111* (2013.01); *H01L 29/4236* (2013.01); *H01L 29/42364* (2013.01); *H01L 29/42368* (2013.01); *H01L 29/66053* (2013.01); *H01L 29/66734* (2013.01)

(58) Field of Classification Search
CPC ......... H01L 29/66068; H01L 29/66734; H01L 29/66053; H01L 29/4236; H01L 29/42364; H01L 29/42368; H01L 21/02236; H01L 21/02126; H01L 21/045; H01L 21/0475
See application file for complete search history.

(56) References Cited

U.S. PATENT DOCUMENTS

| | | | | |
|---|---|---|---|---|
| 6,656,783 B2 * | 12/2003 | Park | ..................... | H01L 27/1052 257/E21.548 |
| 2008/0230787 A1 * | 9/2008 | Suzuki | ................ | H01L 29/0623 257/77 |
| 2012/0248462 A1 * | 10/2012 | Wada | .................. | H01L 29/4236 257/77 |
| 2015/0214061 A1 * | 7/2015 | Zhou | ................. | H01L 29/42368 257/330 |
| 2015/0236127 A1 | 8/2015 | Miyahara et al. | | |
| 2016/0005861 A1 * | 1/2016 | Nishimura | ........ | H01L 29/66734 257/192 |

FOREIGN PATENT DOCUMENTS

JP 2014-053595 A 3/2014

* cited by examiner

*Primary Examiner* — Michael Trinh
(74) *Attorney, Agent, or Firm* — Chen Yoshimura LLP

(57) ABSTRACT

After a trench is formed, a deposition film is formed on the front surface of a base material and an inner wall of the trench such that a thickness of a portion of the deposition film covering the front surface of the base material is greater than a thickness of a portion of the deposition film covering the inner wall of the trench. The total thickness of the deposition film is then reduced until the inner wall of the trench is exposed, leaving only the portion of the deposition film covering the front surface of the base material. By performing sacrificial oxidation in this state, the thermal oxide film caused by thermal oxidation barely grows at the interface of the front surface of the base material and the deposition film, and thus the thickness of an n+ source region is mostly maintained.

5 Claims, 8 Drawing Sheets

METHOD OF MANUFACTURING SILICON CARBIDE SEMICONDUCTOR DEVICE

BACKGROUND OF THE INVENTION

Technical Field

The present invention relates to a method of manufacturing a silicon carbide semiconductor device.

Background Art

Conventionally, in the fabrication (manufacturing) of trench-gate MOSFETs (metal oxide semiconductor field effect transistors), a damage layer forms on the trench inner wall during the etching for forming the trench. The "damage" is surface recesses and protrusions caused by disruption of crystalline structures near the surface and surface roughness due to etching.

Performing sacrificial oxidation on the trench inner wall can remove the damage layer on the trench inner wall, but when the semiconductor material is silicon carbide (SiC), performing sacrificial oxidation after the trench is formed is reported to have negative effects on device characteristics (see Patent Document 1 below, for example). In Patent Document 1 below, a gate oxide film is formed without performing sacrificial oxidation after the trench is formed in order to prevent degradation of the reliability of the gate insulating film.

RELATED ART DOCUMENT

Patent Document

Patent Document 1: Japanese Patent Application Laid-Open Publication No. 2014-053595

SUMMARY OF THE INVENTION

However, the conventional method of removing the damage layer on the trench inner wall by sacrificial oxidation has the following problems. FIGS. 9 to 11 are cross-sectional views showing states during manufacturing of a conventional semiconductor device. During formation of a MOS gate (a metal-oxide-semiconductor insulating gate) structure, first, diffusion regions such as a p-type base region 103 and an $n^+$ source region 104 are formed in the front surface side of a semiconductor wafer made of silicon carbide, and then a trench 105 is formed (FIG. 9). Reference characters 101 and 102 respectively denote an $n^+$ starting substrate and an $n^-$ epitaxial layer. Next, sacrificial oxidation is performed on the inner wall of the trench 105. At such time, an oxide film 111 is grown not only on the inner wall of the trench 105, but also on the front surface of the wafer.

In particular, if the front surface of the wafer is a (000-1) surface or the so-called carbon (C) surface, the growth speed of the oxide film 111 is faster than other crystalline surfaces, and the oxide film 111 is formed thick, and thus more of the thickness of the silicon carbide regions on the front surface side of the wafer is turned into the oxide film 111. In other words, the thickness of the $n^+$ source region 104 in the front surface side of the wafer is reduced. In particular, when the sacrificial oxidation process continues at high temperature for a long time, the $n^+$ source region 104 becomes completely oxidized and is lost by becoming the oxide film 111 (FIGS. 10 and 11). FIG. 10 shows a state in which the n+ source region 104 has completely transformed into the oxide film 111, and FIG. 11 shows a state following FIG. 10 after removing the oxide film 111. There is thus a problem that the function as a MOS gate structure is lost.

In order to eliminate the problems of the conventional technology described above, the present invention aims at providing a method of manufacturing a silicon carbide semiconductor device that can prevent the degradation of reliability caused by performing sacrificial oxidation on the trench inner walls. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a silicon carbide semiconductor device having a trench in a semiconductor substrate made of silicon carbide, the method including: a first step of forming the trench in the semiconductor substrate; a second step of forming a deposition film on a surface of the semiconductor substrate and on an inner wall of the trench such that a thickness of the deposition film on the surface of the semiconductor substrate is greater than a thickness of the deposition film on the inner wall of the trench; a third step of exposing the inner wall of the trench by removing a portion of the deposition film covering the inner wall of the trench; a fourth step, after the third step, of growing a sacrificial oxide film on the inner wall of the trench by oxidation; and a fifth step of removing the deposition film and the oxide film.

Furthermore, the method of manufacturing the silicon carbide semiconductor device of this invention is characterized in that, in the invention described above, in the third step, the inner wall of the trench may be exposed by uniformly etching the deposition film until the portion of the deposition film that covers the inner wall of the trench is completely removed.

Furthermore, the method of manufacturing the silicon carbide semiconductor device of this invention is characterized in that, in the second step, the deposition film may be a silicon oxide film, a silicon nitride film, or a silicon film.

Furthermore, the method of manufacturing the silicon carbide semiconductor device of this invention is characterized in being able to further include, before the first step, a step of forming a prescribed device structure on a surface of the semiconductor substrate where the trench is formed.

Furthermore, the method of manufacturing the silicon carbide semiconductor device of this invention is characterized in being able to further include, before the first step, a step of forming a first semiconductor region of a second conductivity type on the surface of the semiconductor substrate where the trench is formed; and a step of selectively forming a second semiconductor region of a first conductivity type inside the first semiconductor region, wherein, in the first step, the trench is formed penetrating the second semiconductor region and the first semiconductor region in a depth direction, and wherein, after the fifth step, a gate electrode is formed inside the trench with a gate insulating film interposed between the inside of the trench and the gate electrode.

According to the invention described above, after the trench is formed, sacrificial oxidation is performed while the front surface of the substrate is covered by a thick deposited film, and thus the thermal oxide film formed by sacrificial oxidation barely grows on the interface between the front surface of the base member and the deposited film. This mostly maintains the thickness of the diffusion regions in the front surface of the substrate. Meanwhile, it is possible to grow the thermal oxide film thick enough on the inner wall of the trench that the damage layer will be eliminated by sacrificial oxidation. Therefore, it is possible thereafter to remove this thermal oxide film in order to remove the damage layer on the inner wall of the trench.

The method of manufacturing the silicon carbide semiconductor device according to the present invention makes it possible to prevent the degradation of reliability caused by sacrificial oxidation of the trench inner wall. It is to be understood that both the foregoing general description and the following detailed description are exemplary and explanatory, and are intended to provide further explanation of the invention as claimed.

DETAILED DESCRIPTION OF EMBODIMENTS

Figure 1:
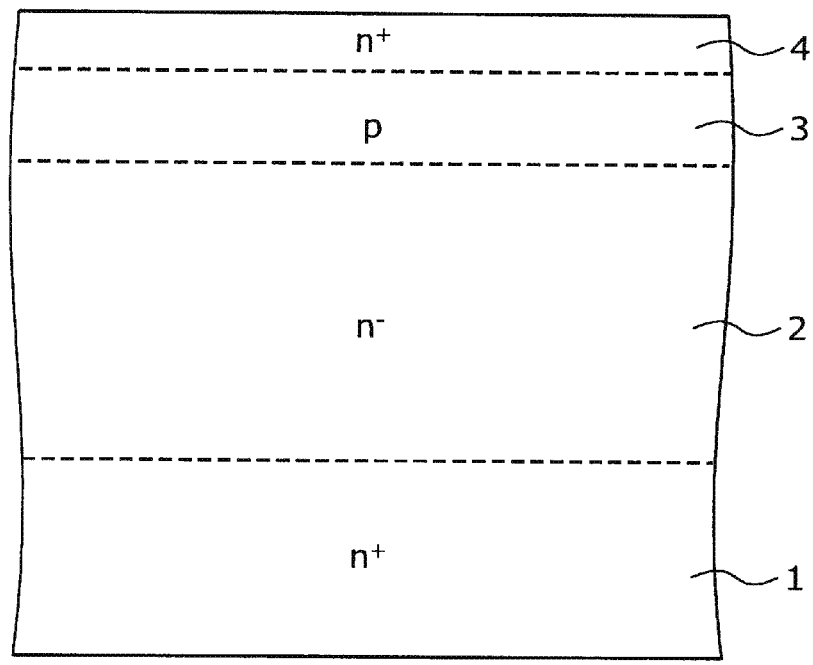
FIG. 1 is a cross-sectional view showing a state during manufacturing of a semiconductor device according to one embodiment.

Suitable embodiments of a method of manufacturing a silicon carbide semiconductor device according to the present invention will be explained in detail below with reference to the attached drawings. In the present specification and attached drawings, electrons or holes in layers or areas marked with an "n" or "p" signify majority carriers. The "+" or "−" attached to the "n" or "p" respectively signify higher impurity concentrations and lower impurity concentrations than layers or areas without these marks. In the explanation of the embodiments below and the attached drawings, the same reference characters are attached to similar configurations and repetitive descriptions will be omitted. When representing Miller indices in the present specification, "−" signifies a bar attached to the index immediately thereafter, and attaching a "−" before the index represents a negative index.

Embodiments

A method of manufacturing a semiconductor device according to an embodiment will be described using an example in which a breakdown voltage 1200V class trench gate MOSFET is fabricated (manufactured). FIGS. 1 to 8 are cross-sectional views of a conventional semiconductor device during the manufacturing thereof. First, as shown in FIG. 1, an n$^-$ silicon carbide epitaxial layer serving as an n$^-$ drift layer 2 is grown on the front surface of an n$^+$ starting substrate made of silicon carbide (hereinafter, n+ silicon carbide substrate) 1 serving as an n$^+$ drain layer. Hereinafter, a silicon carbide base member (semiconductor wafer (semiconductor substrate)) is a silicon carbide epitaxial substrate made by growing an n$^-$ silicon carbide epitaxial layer on the n$^+$ silicon carbide substrate 1.

Next, a plurality of ion implantation rounds are repeatedly performed under differing parameters, and prescribed diffusion regions constituting an ordinary trench gate MOSFET structure (device structure) are formed in the front surface side of the silicon carbide base member (the surface (primary surface) on the silicon carbide epitaxial layer side). Specifically, diffusion regions such as a p-type base region (first semiconductor region) 3, an n$^+$ source region (second semiconductor region) 4, and a p$^+$ contact region (not shown) are formed to constitute the MOS gate structure, for example. The portion of the n− region of the n$^-$ silicon carbide epitaxial layer left at a location deeper from the base material front surface than the diffusion regions due to the diffusion regions not being formed there is the n$^-$ drift layer 2.

Figure 2:
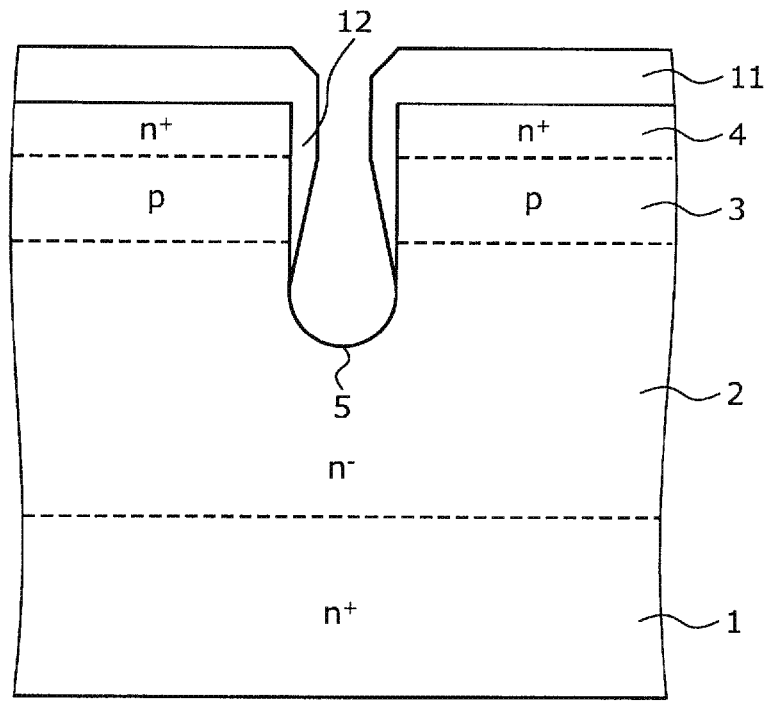
FIG. 2 is a cross-sectional view showing a state during manufacturing of a semiconductor device according to one embodiment.

Next, annealing (a thermal treatment) is performed to activate the diffusion regions. This annealing for activation may be performed each time a diffusion region is formed. Next, as shown in FIG. 2, an oxide film 11 is formed at a thickness of 0.5 μm, for example, on the front surface of the silicon carbide base material. Next, the oxide film 11 is selectively removed by patterning in order to expose the front surface of the base material to the opening the oxide film 11 at a portion corresponding to the forming region of the trench 5. Next, etching is performed with the remaining portion of the oxide film 11 as a mask, and the trench 5 is formed penetrating through the n$^+$ source region 4 and p-type base region 3 to reach the n$^-$ drift layer 2.

Figure 3:
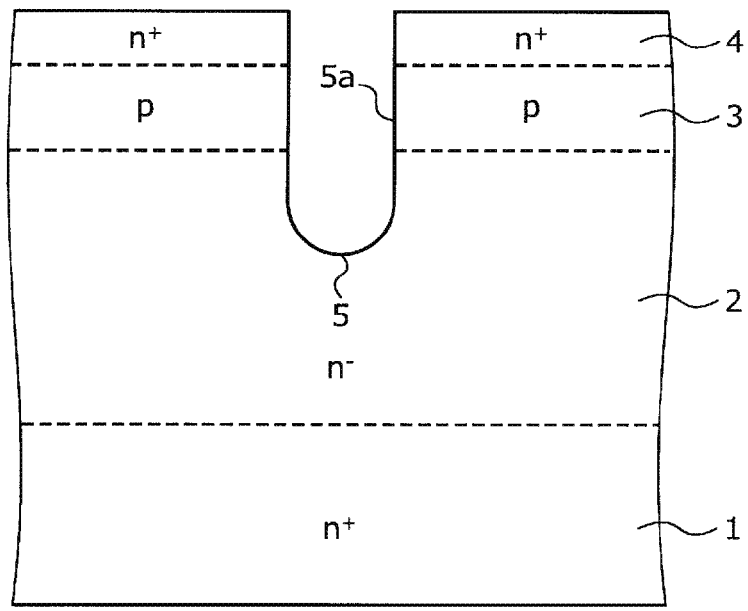
FIG. 3 is a cross-sectional view showing a state during manufacturing of a semiconductor device according to one embodiment.
Figure 4:
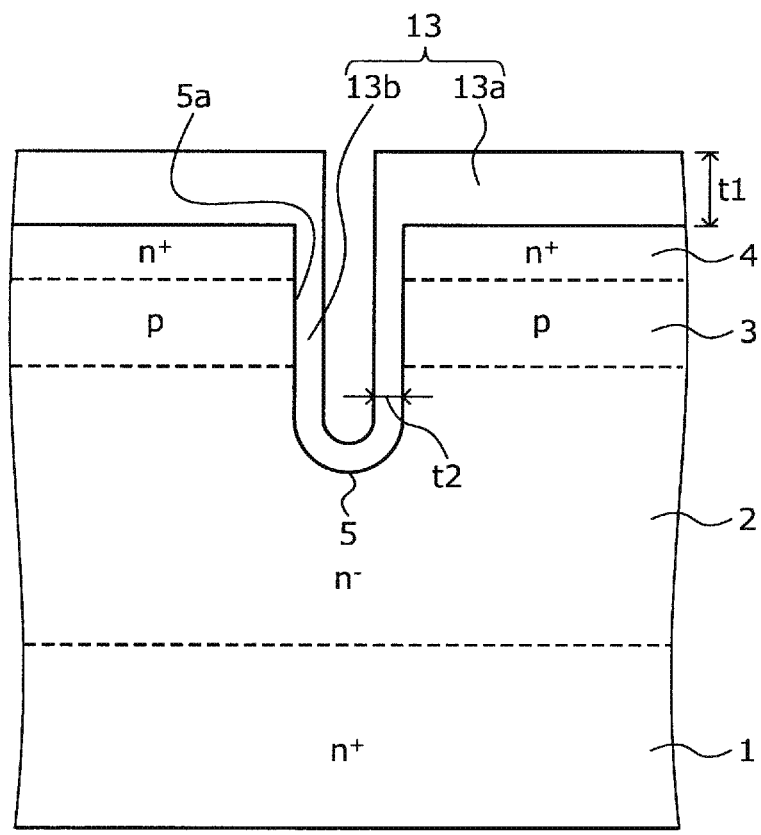
FIG. 4 is a cross-sectional view showing a state during manufacturing of a semiconductor device according to one embodiment.

Next, the remaining deposits 12 from etching for forming the trench 5 and the remains of the oxide film 11 are removed by a hydrofluoric (HF) acid solution, for example (FIG. 3). At this time, a damage layer is formed on the inner wall 5a of the trench 5 due to the etching for forming the trench 5. The "damage" is surface recesses and protrusions caused by disruption of crystalline structures near the surface and surface roughness due to etching. Next, as shown in FIG. 4, a deposition film 13 such as an LTO (low temperature oxide) film is formed on the front surface of the base material and the inner wall 5a of the trench 5. At such time, the film forming parameters of the deposition film 13 are set such that a thickness t1 of a portion 13a of the deposition film 13 covering the front surface of the base material is greater than a thickness t2 of a portion 13b of the deposition film covering the inner wall 5a (t1>t2).

An oxide film serving as the deposition film 13 is formed by causing silane ($SiH_4$) and oxygen ($O_2$) to react under reduced pressure at a temperature of approximately 400° C. for approximately 60 minutes, for example. This makes it possible to grow a deposition film 13 in which the thickness t1 of the portion 13a covering the front surface of the base material is approximately 1.0 μm and the thickness t2 of the portion 13b covering the inner wall 5a of the trench 5 is approximately 0.5 μm.

Figure 5:
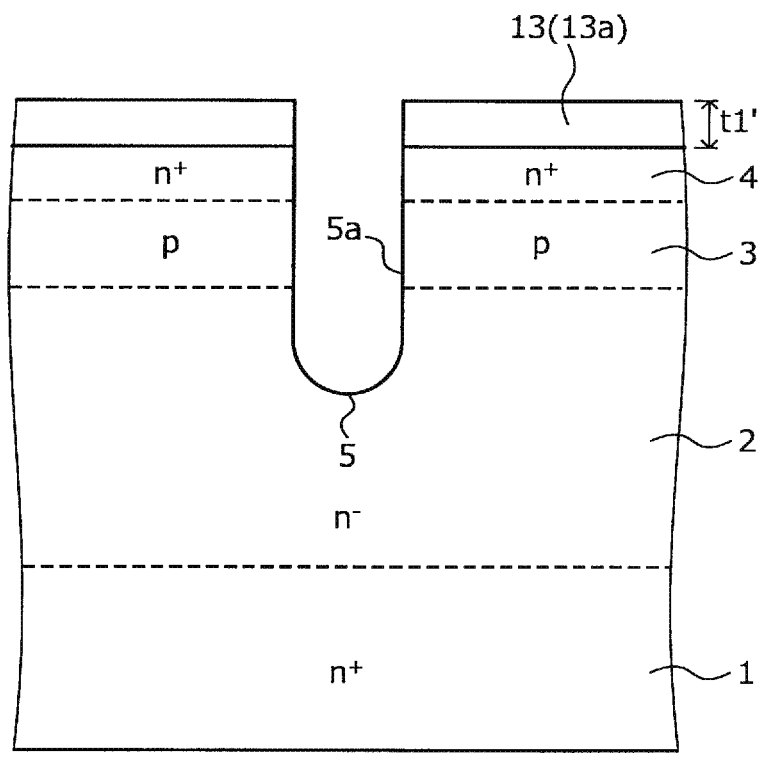
FIG. 5 is a cross-sectional view showing a state during manufacturing of a semiconductor device according to one embodiment.

Next, as shown in FIG. 5, a hydrofluoric (HF) acid solution is used to uniformly reduce the total thickness of the deposition film 13 until the inner wall 5a of the trench 5 is exposed, for example. This completely removes the portion 13b of the deposition film 13 covering the inner wall 5a of the trench 5 and leaves only the portion 13a covering the front surface of the base material. The total thickness of the deposition film 13 is uniformly reduced to 0.6 μm, for example (hereinafter, the thinning of the deposition film 13). In such a case, the thickness t2 of the portion 13b of the deposition film 13 covering the inner wall 5a of the trench 5 is thinner than the amount of the deposition film 13 that was removed (t2<0.6 μm), and thus the portion 13b of the deposition film 13 covering the inner wall 5a of the trench 5 is completely removed. Meanwhile, the thickness t1 of the portion 13a of the deposition film 13 covering the front surface of the base material is thicker than the amount of the deposition film 13 that was removed (t1>0.6 μm), and thus the portion 13a of the deposition film 13 covering the front surface of the base material remains on the front surface of the base material with a thickness t1' of 0.4 μm (t1'=t1−0.6 μm).

In this manner, it is possible to remove only the portion 13b of the deposition film 13 covering the inner wall 5a of the trench 5. The deposition film 13 (13a) remaining on the front surface of the base material functions to prevent the growth of a thermal oxide film 14 during sacrificial oxidation, as described later. It is not possible for the deposition film 13 to be formed only on the regions that were directly intended. Therefore, the deposition film 13 is formed on both the inside of the trench 5 and the front surface of the base material and then must be removed from the inside of the trench 5. At such time, even if the thickness t1 of the portion 13a of the deposition film 13 covering the front surface of the base material were equal to the thickness t2 of the portion 13b covering the inner wall 5a of the trench 5, etching selectively removes only the portion of the deposition film 13 inside the trench 5. In other words, the deposition film 13 is patterned with a resist film that has an opening corresponding to the opening in the trench 5 as a mask, and the portion of the deposition film 13 above the opening in the trench 5 and the portion inside the trench 5 are removed. In such a case, there is a risk that problems with the patterning precision of the resist film could lead to positional deviations in the horizontal direction of the opening in the trench 5 (the direction parallel to the front surface of the base material) and the horizontal direction of the removed portion of the deposition film 13, which would expose the front surface of the base material. As a countermeasure, the present invention makes it possible to remove the portion 13b of the deposition film 13 covering the inner wall 5a of the trench 5 by uniformly reducing the total thickness of the deposition film 13 without using a resist film as a mask and without exposing the front surface of the base material.

Figure 6:
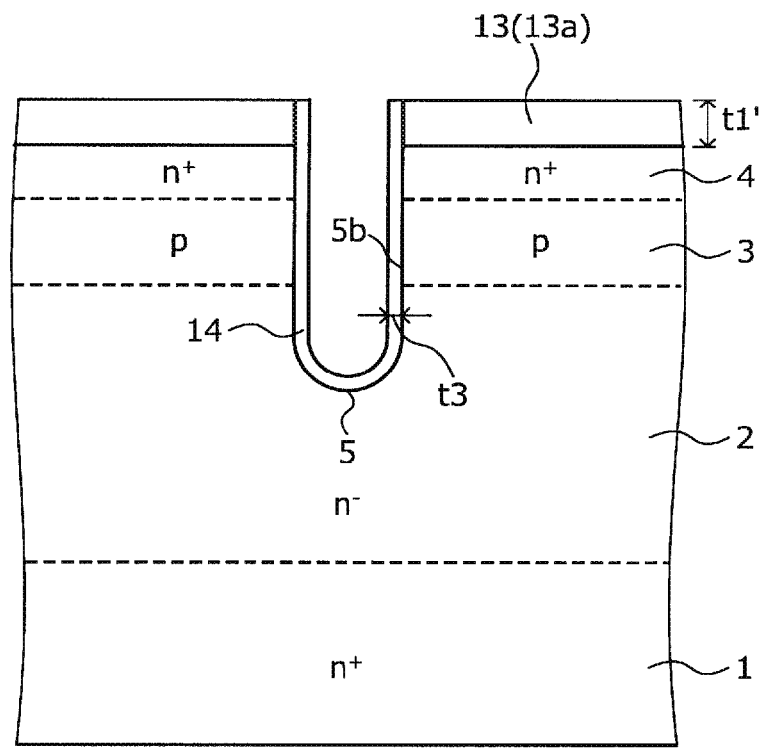
FIG. 6 is a cross-sectional view showing a state during manufacturing of a semiconductor device according to one embodiment.

Next, as shown in FIG. 6, sacrificial oxidation is performed while the front surface of the base material is covered by the deposition film 13 (13a). This sacrificial oxidation oxidizes the damage layer of the inner wall 5a of the trench 5 (see FIG. 3) and grows a thermal oxide film (sacrificial oxide film) 14, and the semiconductor surface at the interface with the thermal oxide film 14 where damage has not occurred serves as the new inner wall 5b of the trench 5. It is preferable that a thickness t3 of the thermal oxide film 14 grown on the inner wall 5a of the trench 5 while the damage layer is formed be at least an amount (e.g., approximately 0.2 μm) that allows complete oxidation and removal of the damage layer on the inner wall 5a of the trench 5.

Meanwhile, during this sacrificial oxidation, the growth speed of the thermal oxide film 14 on the front surface of the base material is slow due to being covered with the thick deposition film 13 (13a), and the thermal oxide film 14 barely grows at the interface between the front surface of the base material and the deposition film 13. In other words, there is almost no occurrence of loss or reduction in thickness of the diffusion regions such as the $n^+$ source region formed in the front surface side of the base material. If the thickness t1' of the portion 13a of the deposition film 13 covering the front surface of the base material after the film thinning is the same as the thickness t3 of the thermal oxide film 14 (t1'=t3), then the amount of reduction in the thickness of the diffusion region on the front surface side of the base material is ($\sqrt{2}-1$) times (=approximately 0.4 times) than if the deposition film 13 were not formed, for example. If the thickness t1' of the portion 13a of the deposition film 13 covering the front surface of the base material after the film thinning is $1/10^{th}$ the thickness t3 of the thermal oxide film 14 grown on the inner wall 5a of the trench 5 (t'/t3=1/10), then the amount of reduction in the thickness of the diffusion region on the front surface side of the base material is 0.9 times than if the deposition film 13 were not formed, for example. Thus, the thickness t1' of the portion 13a of the deposition film 13 covering the front surface of the base material after the film thinning should be around at least $1/10^{th}$ of the thickness t3 of the thermal oxide film 14 grown on the inner wall 5a of the trench 5 while the damage layer is formed (t1'/t3>1/10).

Figure 7:
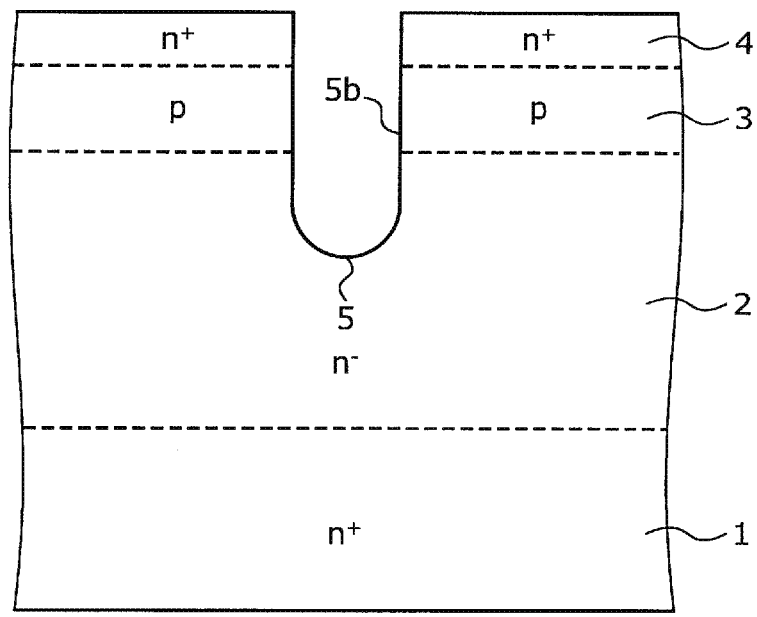
FIG. 7 is a cross-sectional view showing a state during manufacturing of a semiconductor device according to one embodiment.
Figure 8:
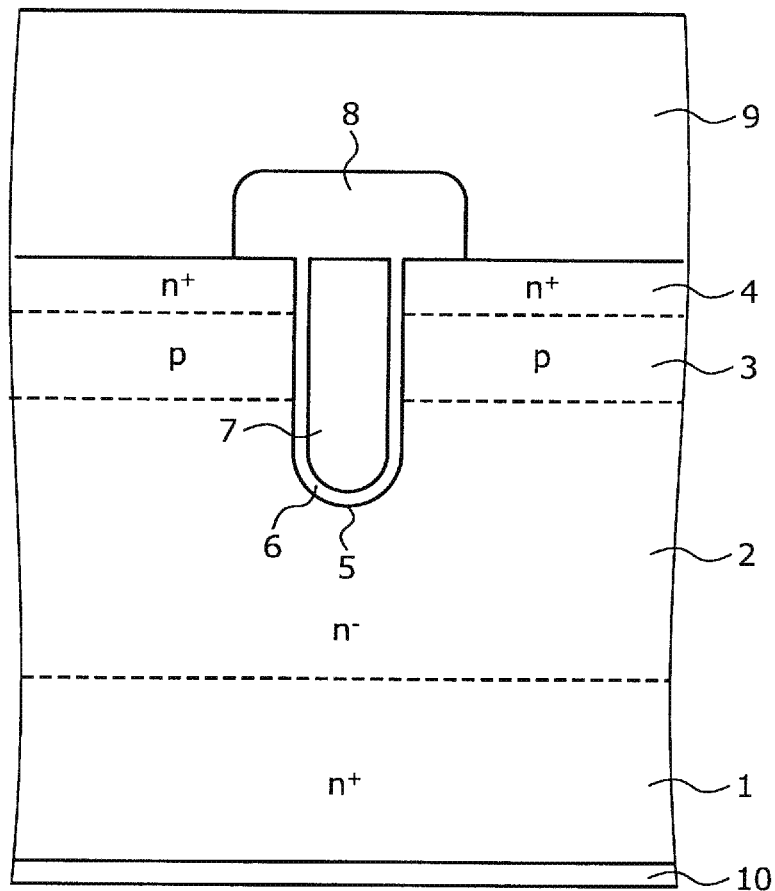
FIG. 8 is a cross-sectional view showing a state during manufacturing of a semiconductor device according to one embodiment.
Figure 9:
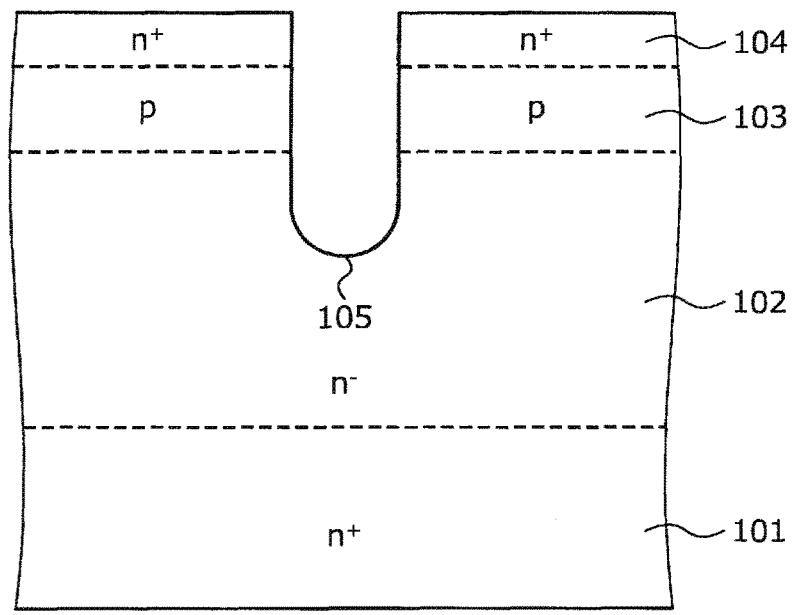
FIG. 9 is a cross-sectional view of a conventional semiconductor device during manufacturing.
Figure 10:
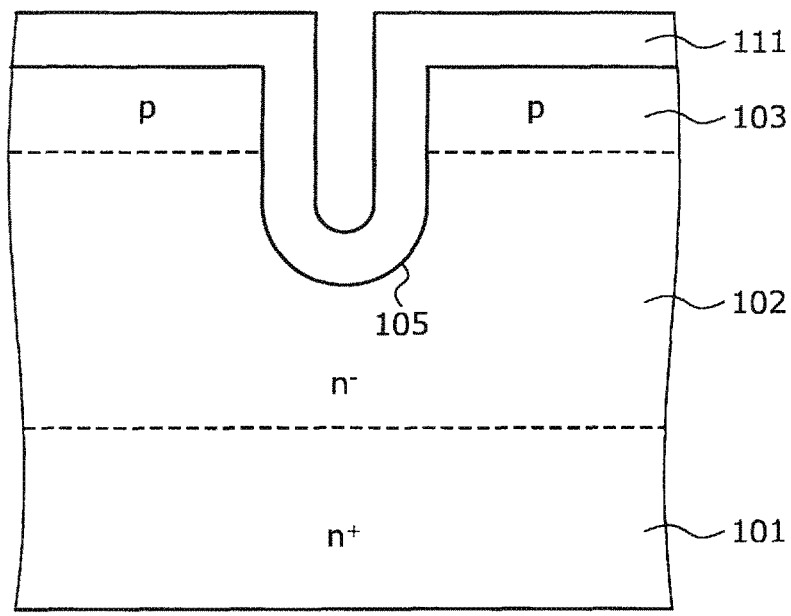
FIG. 10 is a cross-sectional view of a conventional semiconductor device during manufacturing.
Figure 11:
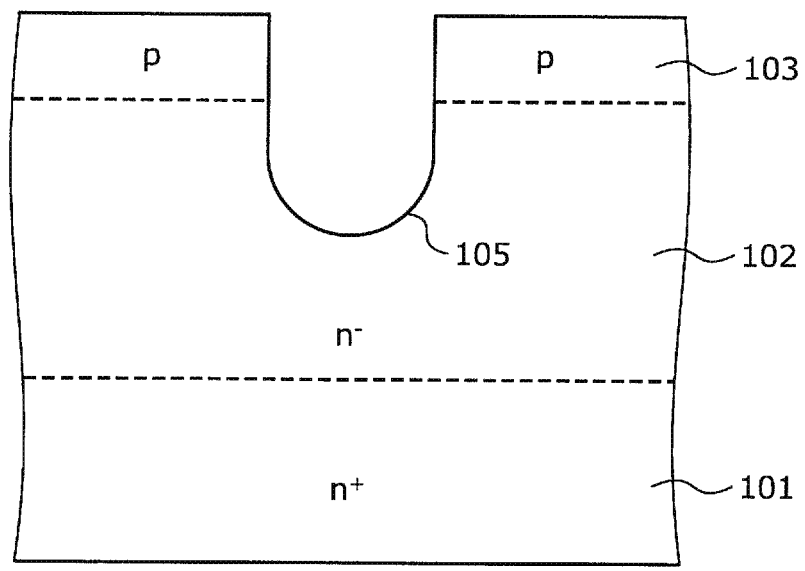
FIG. 11 is a cross-sectional view of a conventional semiconductor device during manufacturing.

Next, the remains (13a) of the deposition film 13 and the thermal oxide film 14 are removed by a hydrofluoric acid solution, for example. This exposes the inner wall 5b of the trench 5 where the damage layer is removed and which is approximately flat. Meanwhile, during the forming of the thermal oxide film 14 as described above, the diffusion region in the front surface of the base material is barely oxidized, and thus the n+ source region 4 completely retains its function as the source region with barely being removed (FIG. 7). Next, an ordinary method is used to form the remaining parts, such as the gate insulating film 6, gate electrode 7, interlayer insulating film 8, source electrode 9, and drain electrode 10. Thereafter, the wafer is diced (cut) into chip-shaped pieces to complete the MOSFET as shown in FIG. 8.

Furthermore, in the method of manufacturing the semiconductor device according to the embodiment described above, the deposition film 13 may alternatively be a silicon oxide ($SiO_2$) film, a silicon nitride (SiN) film, or a silicon (Si) film. If the deposition film 13 is not an oxide film, such as a silicon film, then isotropic etching should be performed to uniformly reduce the total thickness of the deposition film 13 until the inner wall 5a of the trench 5 is exposed so that only the portion 13a of the deposition film 13 covering the front surface of the base material remains, for example.

As described above, the embodiment makes it possible, after the trench is formed, to form a deposition film on the front surface of the base material and the inner wall of trench such that the thickness of the portion of the deposition film covering the front surface of the base material is greater than the thickness of the portion of the deposition film covering the inner wall of the trench, thereby later allowing the deposition film on the front surface of the base material to be left when the inner wall of the trench is exposed. Sacrificial oxidation is performed in this state, and thus the thermal oxide film caused by thermal oxidation barely grows at the interface of the front surface of the base material and the deposition film. Therefore, it is possible to approximately maintain the thickness of the diffusion region, such as the $n^+$ source region, in the front surface of the base material. This makes it possible to minimize the loss or reduction in thickness of the diffusion region, which allows for the prevention of loss of function as a MOS gate structure. Meanwhile, it is possible to grow the thermal oxide film thick enough on the inner wall of the trench that the damage layer will be eliminated by sacrificial oxidation. Thus, thereafter, removing this thermal oxide film can remove the damage layer on the inner wall of the trench, which makes it possible to prevent deterioration of device characteristics. Accordingly, it is possible to prevent degradation in reliability caused by performing thermal oxidation on the inner wall of the trench.

The present invention is not limited to the embodiment described above, and various modifications can be made without departing from the spirit of the present invention. In the embodiment described above, a trench gate MOSFET is described as an example, but similar effects are exhibited when the present invention is applied to a MOS semiconductor device such as an IGBT (insulated gate bipolar transistor) equipped with a trench gate MOS, for example. In addition, the present invention can be applied to semiconductor devices having various configurations fabricated by a manufacturing process including steps where the trench and the inner wall of the trench undergo sacrificial oxidation.

Moreover, in the embodiment described above, an example was described in which the base region and source region forming a portion of the MOS gate structure was the diffusion region, but similar effects are exhibited when the base region or source region are formed by epitaxial growth. In the embodiment described above, various modifications can be performed in accordance with the desired specifications or the like, such as the dimensions of the respective components or the breakdown voltage class, for example. In the embodiments described above, the first conductivity type is n-type, and the second conductivity type is p-type, but the present invention is applicable even when the first conductivity type is p-type and the second conductivity type is n-type.

INDUSTRIAL APPLICABILITY

As described above, a method of manufacturing a silicon carbide semiconductor device according to the present invention is useful for power semiconductor devices used in power supplies or the like for power converters or various types of industrial machinery, and is particularly suited for trench gate MOS semiconductor devices having silicon carbide as a semiconductor material.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a silicon carbide semiconductor device having a trench in a semiconductor substrate made of silicon carbide, the method comprising:
    a first step of forming the trench in the semiconductor substrate;
    a second step of forming a deposition film on a surface of the semiconductor substrate and on an inner wall of the trench such that a thickness of the deposition film on the surface of the semiconductor substrate is greater than a thickness of the deposition film on the inner wall of the trench;
    a third step of exposing the inner wall of the trench by removing a portion of the deposition film covering the inner wall of the trench;
    a fourth step, after the third step, of growing a sacrificial oxide film on the inner wall of the trench by oxidation; and
    a fifth step of removing the deposition film and the oxide film.

2. The method of manufacturing the silicon carbide semiconductor device according to claim 1, wherein, in the third step, the inner wall of the trench is exposed by uniformly etching the deposition film until the portion of the deposition film that covers the inner wall of the trench is completely removed.

3. The method of manufacturing the silicon carbide semiconductor device according to claim 1, wherein, in the second step, the deposition film is a silicon oxide film, a silicon nitride film, or a silicon film.

4. The method of manufacturing the silicon carbide semiconductor device according to claim 1, further comprising, before the first step, a step of forming a prescribed device structure on a surface of the semiconductor substrate where the trench is formed.

5. The method of manufacturing the silicon carbide semiconductor device according to claim 4, further comprising, before the first step:
    a step of forming a first semiconductor region of a second conductivity type on the surface of the semiconductor substrate where the trench is formed; and
    a step of selectively forming a second semiconductor region of a first conductivity type inside the first semiconductor region,
    wherein, in the first step, the trench is formed penetrating the second semiconductor region and the first semiconductor region in a depth direction, and
    wherein, after the fifth step, a gate electrode is formed inside the trench with a gate insulating film interposed between the inside of the trench and the gate electrode.

* * * * *